(12) United States Patent
Nakamura et al.

(10) Patent No.: US 9,099,979 B2
(45) Date of Patent: Aug. 4, 2015

(54) HIGH-FREQUENCY CIRCUIT MODULE (71) Applicant: Taiyo Yuden Co., Ltd., Tokyo (JP)

(72) Inventors: Hiroshi Nakamura, Tokyo (JP); Tomohiro Igarashi, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 245 days.

(21) Appl. No.: 13/952,509

(22) Filed: Jul. 26, 2013

(65) Prior Publication Data
US 2014/0055956 A1    Feb. 27, 2014

(30) Foreign Application Priority Data

Aug. 21, 2012  (JP) .................................. 2012-182286
Nov. 13, 2012  (JP) .................................. 2012-249160

(51) Int. Cl.
H05K 1/18    (2006.01)
H03H 1/00    (2006.01)
H05K 1/02    (2006.01)
(Continued)

(52) U.S. Cl.
CPC .......... *H03H 1/0007* (2013.01); *H01L 23/3677* (2013.01); *H01L 23/3735* (2013.01); *H03H 7/463* (2013.01); *H03H 9/08* (2013.01); *H03H 11/344* (2013.01); *H03H 11/348* (2013.01); *H04B 1/44* (2013.01); *H04L 5/14* (2013.01); *H05K 1/0206* (2013.01); *H05K 1/0207* (2013.01); *H05K 1/0216* (2013.01); *H05K 1/185* (2013.01); *H05K 3/4608* (2013.01); *H01L 2924/0002* (2013.01); *H03H 9/0566* (2013.01); *H03H 2001/0085* (2013.01); *H04B 1/58* (2013.01); *H05K 1/0237* (2013.01); *H05K 1/0243* (2013.01)

(58) Field of Classification Search
USPC ................. 361/760–766, 782–784, 795, 803; 333/126–133; 455/78
See application file for complete search history.

(56) References Cited

U.S. PATENT DOCUMENTS 6,879,488 B2 * 4/2005 Takeda et al. ................. 361/704
8,536,957 B1 * 9/2013 Nakamura et al. ............ 333/132
(Continued)

FOREIGN PATENT DOCUMENTS

JP    2005198051    7/2005
JP    2006203652    8/2006
(Continued)

OTHER PUBLICATIONS

Office Action in related Japanese Application No. 2013-179357, dated Sep. 25, 2013, along with an English translation.
(Continued)

*Primary Examiner* — Tuan T Dinh
(74) *Attorney, Agent, or Firm* — Edell, Shapiro & Finnan LLC (57) ABSTRACT A high-frequency circuit module having a high mounting density is provided. The high-frequency circuit module includes an RFIC configured to transmit and receive a high-frequency signal, a power amplifier IC configured to amplify a transmission signal output from the RFIC, and duplexers configured to separate the transmission signal output from the power amplifier IC and input to an antenna and a received signal from the antenna and input to the RFIC from each other, wherein at least one of the RFIC and power amplifier IC is embedded in the circuit board, and the duplexers are disposed between the RFIC and the power amplifier IC.

10 Claims, 4 Drawing Sheets (51) Int. Cl.
  *H01L 23/373* (2006.01)
  *H03H 7/46* (2006.01)
  *H03H 9/08* (2006.01)
  *H04B 1/44* (2006.01)
  *H04L 5/14* (2006.01)
  *H05K 3/46* (2006.01)
  *H03H 11/34* (2006.01)
  *H01L 23/367* (2006.01)
  *H03H 9/05* (2006.01)
  *H04B 1/58* (2006.01)

(56) References Cited

U.S. PATENT DOCUMENTS

2005/0151599 A1* 7/2005 Ido et al. .................... 333/133
2008/0212552 A1* 9/2008 Fukamachi et al. .......... 370/343
2009/0195334 A1* 8/2009 Goi et al. ..................... 333/203
2010/0182755 A1* 7/2010 Maejima et al. .............. 361/748

FOREIGN PATENT DOCUMENTS

| JP | 2006340257 | 12/2006 |
| JP | 2008072738 | 3/2008 |
| JP | 2010161801 | 7/2010 |
| JP | 2011187831 | 9/2011 |

OTHER PUBLICATIONS

Office Action in related Japanese Application No. 2013-179365, dated Nov. 20, 2013, along with an English translation.

* cited by examiner

HIGH-FREQUENCY CIRCUIT MODULE

CROSS REFERENCE TO RELATED APPLICATIONS

This application claims foreign priority under 35 U.S.C. §119(a)-(d) to Application No. JP 2012-182286 filed on August 21, 2012 and Application No. JP 2012-249160 filed on Nov. 13, 2012, the entire contents of each of which are hereby incorporated by reference.

FIELD OF THE INVENTION

The present invention relates to a high-frequency circuit module wherein a high-frequency integrated circuit (IC), a power amplifier IC, and a duplexer are mounted on a circuit board, and more particularly, to an arrangement of components of a high-frequency circuit module.

BACKGROUND

Recently, multi-functional mobile phones having a small size, so-called smart phones, are being developed. In such mobile phones, a high-frequency circuit module with a circuit board having thereon various components for transmitting and receiving a high-frequency signal is mounted on a mother board (for example, see Japanese Unexamined Patent Application Publication No. 2005-198051). In a high-frequency circuit module disclosed in Japanese Unexamined Patent Application Publication No. 2005-198051, a high-frequency integrated circuit (IC) configured to transmit and receive a high-frequency signal, a power amplifier IC configured to amplify a transmission signal, a transmission filter, a receiving filter, a high-frequency switch, etc. are mounted on a circuit board. An output signal of the power amplifier IC passes through, in sequence, a transmission matching circuit, the transmission filter and the high-frequency switch, and is then output through an antenna. A received signal received through the antenna passes through, in sequence, the high-frequency switch, the receiving filter and a receiving matching circuit and is then input to the high-frequency IC. Here, a signal wire for transmitting the transmission signal from the high-frequency IC to the high-frequency switch and a signal wire for transmitting the received signal from the high-frequency switch to the high-frequency IC are disposed on the circuit board in a manner that these signal wires do not intersect with each other and are not adjacent to each other. Japanese Unexamined Patent Application Publication No. 2006-340257 discloses a multi-mode high-frequency circuit wherein a GSM-based circuit system unrelated to operation of W-CDMA circuit system is disposed along a shortest path between the circuit system configured to handle a W-CDMA RF transmission signal and a receiving circuit configured to handle a W-CDMA RF received signal capable of reducing signal interference between a W-CDMA transmission circuit and a W-CDMA receiving circuit.

However, conventional technology is not capable of properly meeting the latest demands for smaller and more highly integrated mobile phones. In the high-frequency circuit module disclosed in Japanese Unexamined Patent Application Publication No. 2005-198051, the power amplifier IC is disposed immediately adjacent to the high-frequency IC such that a signal wire for a received signal passes through the vicinity of the power amplifier IC due to miniaturization and high density. Thus, noise or a leakage signal generated by the power amplifier IC is likely to enter into a receiving circuit of the high-frequency IC. In the block for W-CDMA of a first communication technique disclosed in Japanese Unexamined Patent Application Publication No. 2006-340257, a duplexer 100 is distant from the high-frequency IC 310 although a W-PA-IC 121 corresponding to the power amplifier IC is spaced apart from a high-frequency IC 310. Thus, noise or a leakage signal generated by the power amplifier IC is mixed with a received signal passing through the duplexer 100 in the receiving circuit of the high-frequency IC.

SUMMARY

It is an object of the present invention to provide a high-frequency circuit module having a high installation density.

According to one aspect of the present invention, there is provided a high-frequency circuit module comprising: a circuit board including an insulating layer and a conductive layer that are alternately stacked; a high-frequency IC installed at the circuit board to transmit and receive a high-frequency signal; a power amplifier IC installed at the circuit board to amplify a transmission signal received from the high-frequency IC; and a duplexer installed between the high-frequency IC and the power amplifier IC to separate the transmission signal output from the power amplifier IC and input to an antenna and a received signal output from the antenna and input to the high-frequency IC from each other, wherein at least one of the high-frequency IC and the power amplifier IC is embedded in the circuit board.

According to the present invention, a signal wire for inputting the received signal from the duplexer to the high-frequency IC need not be disposed near the power amplifier IC, and can be shortened. Such structure facilitates the miniaturization and high density while preventing noise from entering the receiving circuit of the high-frequency IC. In addition, the transmission signal output from the high-frequency IC passes through the vicinity of the duplexer to be input to the power amplifier IC. However, the transmission signal has only a small influence on the duplexer or other circuits. Since the power amplifier IC and the duplexer are disposed adjacent to each other, the length of the signal wire for transmitting the amplified transmission signal can be reduced. That is, the signal wire for transmitting the signal amplified by the power amplifier IC to the duplexer can be shorter than the signal wire for transmitting the signal before amplification output from the high-frequency IC. Accordingly, power loss and noise may be minimized. In addition, the duplexer may be mounted on or embedded in the circuit board.

Preferably, the circuit board may include a ground electrode disposed on a bottom surface thereof. The power amplifier IC may be embedded in the circuit board. The power amplifier IC may include a heat-dissipating electrode connected to the ground electrode through a via conductor. According to the present invention, the distance between the heat-dissipating electrode of the power amplifier IC and the ground electrode disposed at a bottom surface of the circuit board may be minimized, thereby improving the heat dissipation efficiency.

Preferably, the circuit board may further include a core conductive layer that is thicker than the conductive layer and that functions as an electric ground. At least one of the high-frequency IC and the power amplifier IC may be disposed in a through-hole or a recessed portion disposed in the core conductive layer. According to the present invention, the shielding and heat dissipating properties of high-frequency IC and the power amplifier IC are improved due to the core layer.

DETAILED DESCRIPTION

First Embodiment

Figure 1:
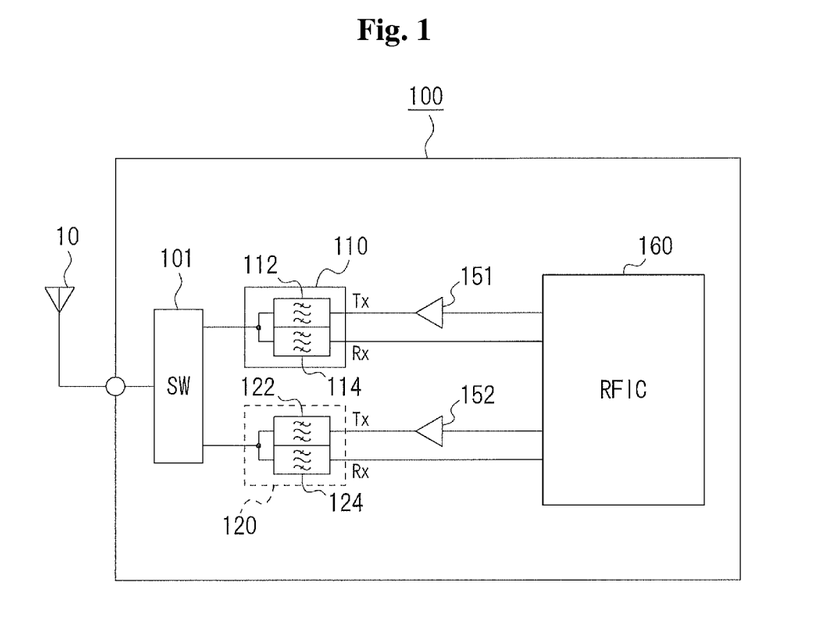
FIG. 1 is a circuit diagram schematically illustrating a high-frequency circuit module according to a first embodiment of the present invention.

A high-frequency circuit module according to a first embodiment of the present invention will now be described with reference to accompanying drawings. FIG. 1 is a circuit diagram schematically illustrating a high-frequency circuit module. The description of the first embodiment will be focused on the main constitution of the present invention for simplification.

A high-frequency circuit module 100 according to the first embodiment is preferably used in mobile phones employing two frequency bands. As shown in FIG. 1, the high-frequency circuit module 100 includes a high-frequency switch 101, a first duplexer 110, a second duplexer 120, high-frequency transmission power amplifiers 151 and 152 for transmission and a radio-frequency integrated circuit (RFIC) 160. Although the high-frequency circuit module 100 comprises a matching circuit, a band pass filter for a transmission signal and the like for each of frequency bands when implemented as a actual circuit, they are omitted in the first embodiment for simplification.

The high-frequency switch 101 switches between a connection between the first duplexer 110 and an external antenna 10 and a connection between the second duplexer 120 and the external antenna 10.

The first duplexer 110 includes a transmission filter 112 and a receiving filter 114, and the second duplexer 120 includes a transmission filter 122 and a receiving filter 124. Various filters such as a surface acoustic wave (SAW) filter and a bulk acoustic wave (BAW) filter may be used as the transmission filters 112 and 122 and the receiving filters 114 and 124. In the first embodiment, the SAW filter is used. The transmission filters 112 and 122 are connected to a transmission port of the RFIC 160 through the high-frequency power amplifiers 151 and 152, respectively. The receiving filters 114 and 124 are connected to a receiving port of the RFIC 160. The high-frequency power amplifiers 151 and 152 are packaged into a single power amplifier IC 155. The RFIC 160 modulates/demodulates or multiplexes a high-frequency signal, e.g., a transmission signal or a received signal.

Figure 2:
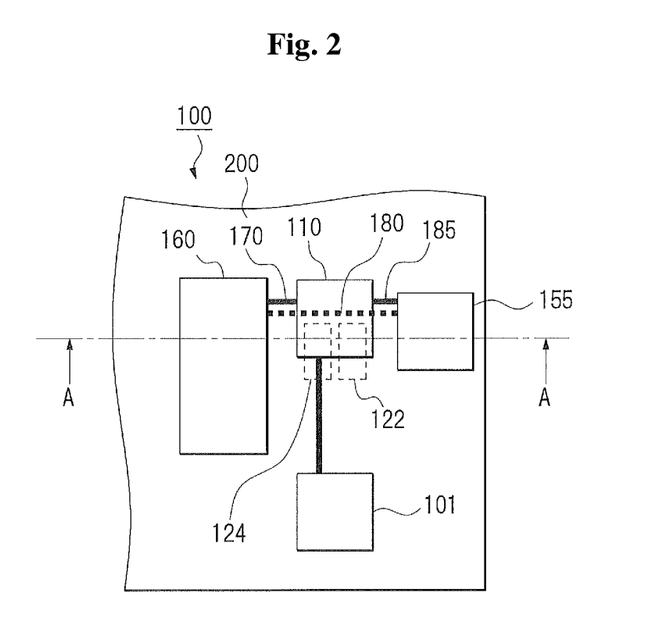
FIG. 2 is a top view of the high-frequency circuit module according to the first embodiment of the present invention.
Figure 3:
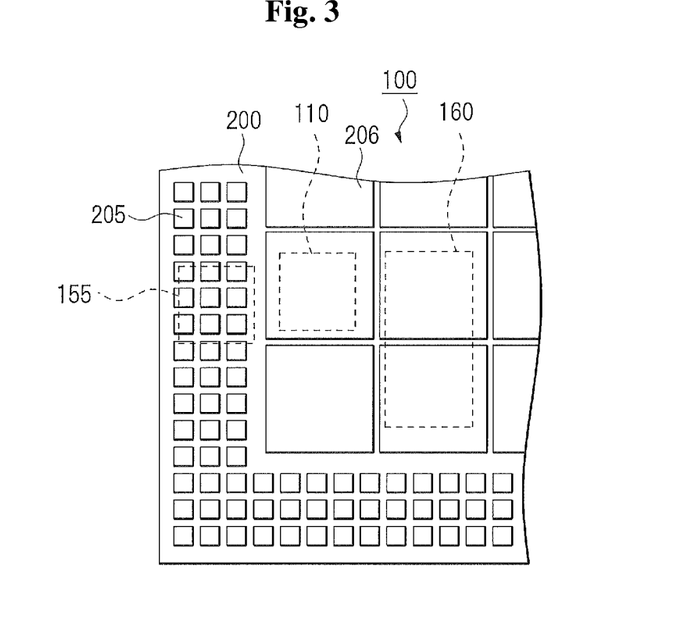
FIG. 3 is a bottom view of the high-frequency circuit module according to the first embodiment of the present invention.
Figure 4:
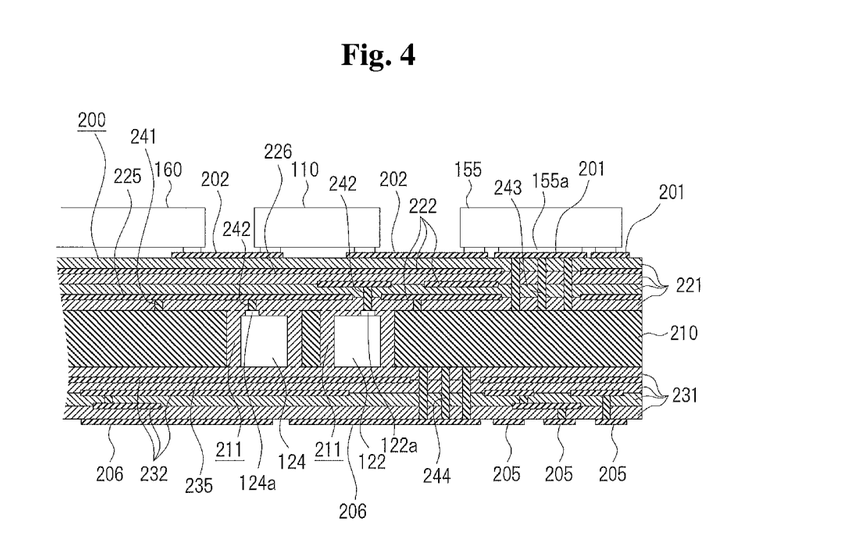
FIG. 4 is a cross-sectional view of the high-frequency circuit module according to the first embodiment of the present invention.

Next, the structure of the high-frequency circuit module 100 will be described with reference to FIGS. 2 through 4. FIG. 2 is a top view of the high-frequency circuit module 100. FIG. 3 is a bottom view of the high-frequency circuit module 100. FIG. 4 is a cross-sectional view taken along line A-A of FIG. 2.

As shown in FIG. 2, the RFIC 160, the first duplexer 110, the power amplifier IC 155 and the high-frequency switch 101 are mounted on a top surface of a circuit board 200 in the high-frequency circuit module 100. The first transmission filter 112 and the first receiving filter 114 in are accommodated one surface-mount package to constitute the first duplexer 110. The second duplexer 120 is embedded in the circuit board 200. Here, the second duplexer 120 has a structure in which elements thereof (the transmission filter 122, the receiving filter 124, etc.) are individually embedded in the circuit board 200. That is, the elements of the second duplexer 120 are not accommodated in a single package contrary to the first duplexer 110.

The circuit board 200 is multilayered including alternately stacked insulating layer and conductive layer. As shown in FIG. 4, the circuit board 200 includes a core layer 210 which is a conductive layer having high conductivity and made of a relatively thick metal, a plurality of insulating layers 221 and a plurality of conductive layers 222 that are disposed on a first main surface, i.e., a top surface, of the core layer 210 and a plurality of insulating layers 231 and a plurality of conductive layers 232 that are disposed on a second main surface, i.e., a bottom surface, of the core layer 210. The insulating layers 221 and 231 and the conductive layers 222 and 232 are disposed on the respective main surfaces of the core layer 210 according to a build-up technique. Here, two layers among the conductive layers 222 disposed between the first main surface (top surface) of the core layer 210 and the first main surface (top surface) of the circuit board 200 and one layer among the conductive layers 232 disposed between the second main surface (bottom surface) of the core layer 210 and the second main surface (top surface) of the circuit board 200 serves as ground conductive layers 225, 226 and 235 of a reference potential (ground). The ground conductive layers 225 and 235 are the conductive layers 222 and 232 closest to the core layer 210, and connected to the core layer 210 through a via conductor 241. Thus, the core layer 210 may also serve as a ground conductor. In addition, the conductive layer 222 is disposed between the two ground conductive layers 225 and 226 and enables a wire formed in the conductive layer 222 to serve as a strip line. Conductive lands 201 or wires 202 are disposed on the first main surface (top surface) of the circuit board 200 for mounting components thereon. In addition, a plurality of terminal electrodes 205 are disposed on an edge portion of the second main surface (bottom surface) of the circuit board 200. A plurality of ground electrodes 206 that are larger than the plurality of terminal electrodes 205 in area are disposed on a region of the second main surface (bottom surface) of circuit board 200 interior to the region where the plurality of terminal electrodes 205 are disposed. The RFIC 160, the first duplexer 110 and the power amplifier IC 155 are soldered to the plurality of lands 201.

Through-holes 211 for accommodating components are disposed in the core layer 210. In the through-holes 211, the second transmission filter 122 and the second receiving filter 124 of the second duplexer 120 are disposed. Thus, the core layer 210 is preferably thicker than the components embedded therein. In the first embodiment, the core layer 210 is made from a metal plate, and more particularly, a metal plate made of copper or a copper alloy. Spaces between the components accommodated in the through-holes 211 are filled with an insulator, e.g., resin, such that the insulating layers 221 or 231 are integrally formed with the insulator. Terminal electrodes 122a and 124a are disposed on a top surface of the second transmission filter 122 and a top surface of the second receiving filter 124, respectively. The terminal electrodes 122a and 124a are connected to the conductive layers 222 through a via conductor 242.

The high-frequency circuit module 100 according to the present invention is characterized in that the first duplexer 110 and the second duplexer 120 (i.e., the second transmission filter 122 and the second receiving filter 124) are disposed between the RFIC 160 and the power amplifier IC 155 as shown in FIG. 2. Thus, a length of a signal wire 170 for inputting a received signal from the first duplexer 110 or the second duplexer 120 to the RFIC 160 can be reduced, and noise can be greatly suppressed from entering the signal wire 170. As shown in FIG. 2, the received signal received from the first duplexer 110 is input to the RFIC 160 through the signal wire 170 disposed on the top surface of the circuit board 200. The transmission signal outputted from the RFIC 160 is input to the power amplifier IC 155 through a signal wire 180 disposed on an internal layer of the circuit board 200, and more particularly, on the conductive layers 222 interposed between the two ground conductive layers 225 and 226. An amplified transmission signal output from the power amplifier IC is input to the first duplexer 110 through a signal wire 185 disposed on the top surface of the circuit board 200. Here, the signal wire 185 for transmitting the signal amplified by the power amplifier IC is shorter than the signal wire 180 for transmitting a signal before amplification output from the RFIC 160. In addition, in FIG. 2, signal wires through which signals are input to and output from the second duplexer 120 are omitted for simplification.

The high-frequency circuit module 100 according to the present invention is also characterized in that the power amplifier IC 155 is installed at the edge portion of the circuit board 200 as shown in FIGS. 2 and 3. As shown in FIG. 3, when viewed from the top of the circuit board 200, the power amplifier IC 155 overlaps with a portion of the terminal electrodes 205. In addition, as shown in FIG. 4, a ground terminal 155a of the power amplifier IC 155 is mounted on the lands 201 of the circuit board 200, and the lands 201 are connected to the core layer 210 through a plurality of conductors 243 for heat dissipation. In addition, the core layer 210 is connected to the ground electrodes 206 below the core layer 210 through a plurality of conductors 244 for heat dissipation. In the structure described above, the heat generated from the power amplifier IC 155 is conducted in the vertical direction of the circuit board 200 through the conductors 243 and along the core layer 210 in the horizontal direction. The heat generated from the core layer 210 is conducted to the ground electrodes 206 through the conductors 244, and dissipated to the circuit board 200 wherein the core layer 210 is disposed.

In the high-frequency circuit module 100 described above, since the duplexers 110 and 120 are disposed between the RFIC 160 and the power amplifier IC 155, the signal wire for inputting the received signal from the duplexer 110 or 120 to the RFIC 160 need not be located near the power amplifier IC 155. In addition, the length of the signal wire for inputting the received signal from the duplexer 110 or 120 to the RFIC 160 can be reduced. Such structure facilitates the miniaturization and high density while preventing noise from entering the receiving circuit of the RFIC 160. In addition, the transmission signal output from the RFIC 160 passes through the vicinity of the duplexers 110 and 120 to be input to the power amplifier IC 155. However, the transmission signal has only a small influence on the duplexers 110 and 120 or other circuits because the transmission signal is not yet amplified. Moreover, since the power amplifier IC 155 and the duplexers 110 and 120 are disposed adjacent to one another, the length of the signal wire transmitting the amplified transmission signal can be reduced. Accordingly, power loss and noise are minimized.

In addition, in the high-frequency circuit module 100 according to the first embodiment, the heat generated from the power amplifier IC can be dissipated to the circuit board 200 through the conductors 243 and 244 and the core layer 210 even when the power amplifier IC 155 is disposed on the edge portion of the circuit board 200. Thus, the RFIC 160 can be disposed in the region interior to the edge portion of the circuit board 200. Accordingly, the arrangement of components or the design of circuit pattern, particularly at the vicinity of the RFIC 160, is facilitated and the length of the signal wires may be reduced, thereby improving the high-frequency characteristics of the high-frequency circuit module 100.

Figure 5:
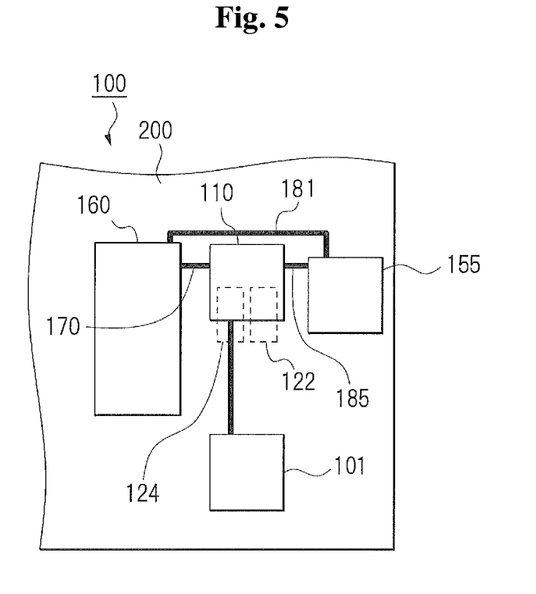
FIG. 5 is a top view of a high-frequency circuit module according to another example of the first embodiment of the present invention.

While the transmission signal transmitted from the RFIC 160 is input to the power amplifier IC 155 through the signal wire 180 disposed on the internal layer of the circuit board 200 in accordance with the first embodiment, the transmission signal may be input to the power amplifier IC 155 through the signal wire 181 disposed on the circuit board 200 as shown in FIG. 5.

Second Embodiment

A high-frequency circuit module according to a second embodiment of the present invention will now be described with reference to the accompanying drawings. The high-frequency circuit module according to the second embodiment differs from the high-frequency circuit module according to the first embodiment in the installation structures of the RFIC and the power amplifier IC. Since other features of the high-frequency circuit module according to the second embodiment are similar to those of the high-frequency circuit module according to the first embodiment, the detailed description of the high-frequency circuit module according to the second embodiment will be focused on the differences between the high-frequency circuit modules according to the first and second embodiments.

Figure 6:
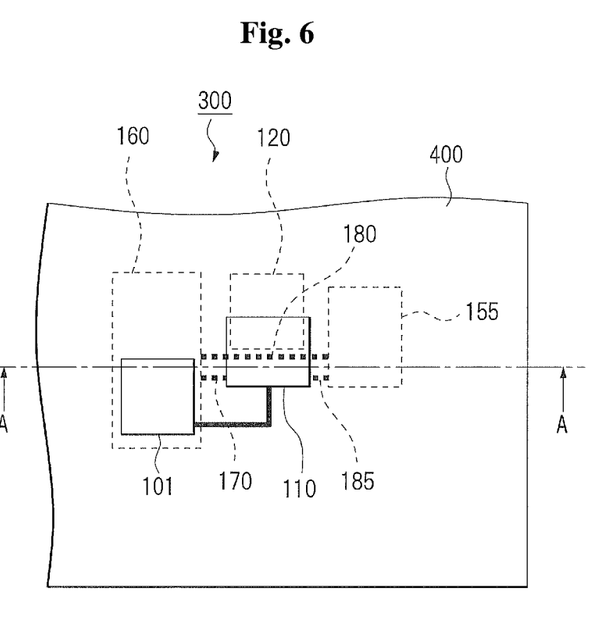
FIG. 6 is a top view of a high-frequency circuit module according to a second embodiment of the present invention.
Figure 7:
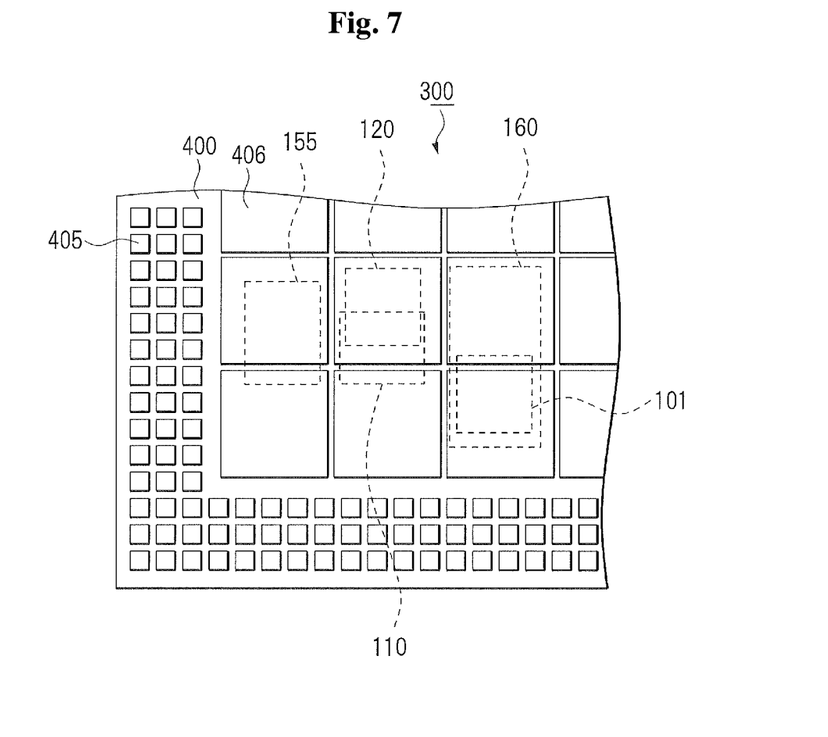
FIG. 7 is a bottom view of the high-frequency circuit module according to the second embodiment of the present invention.
Figure 8:
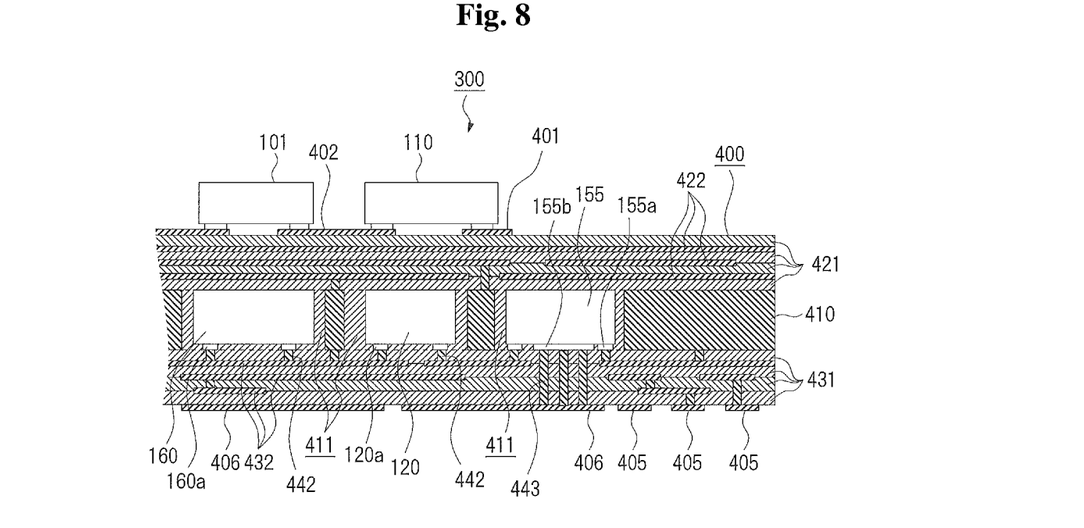
FIG. 8 is a cross-sectional view of the high-frequency circuit module according to the second embodiment of the present invention.

The structure of a high-frequency circuit module 300 according to the second embodiment will now be described with reference to FIGS. 6 through 8. FIG. 6 is a top view of the high-frequency circuit module 300. FIG. 7 is a bottom view of the high-frequency circuit module 300. FIG. 8 is a cross-sectional view taken along line A-A of FIG. 6.

As shown in FIG. 6, in the high-frequency circuit module 300 includes a high-frequency switch 101 and a first duplexer 110 mounted on a top surface of a circuit board 400. The first duplexer 110 is an individual component in which a first transmission filter 112 and a first receiving filter 114 are accommodated as a single package. A second duplexer 120, an RFIC 160 and a power amplifier IC 155 are embedded in the circuit board 400. The second duplexer 120 is an individual component in which a second transmission filter 122 and a second receiving filter 124 are accommodated in a single surface mounting package.

The circuit board 400 is multilayered including alternately stacked insulating layer and conductive layer. As shown in FIG. 8, the circuit board 400 includes a core layer 410 which is a conductive layer having high conductivity and made of a relatively thick metal, a plurality of insulating layers 421 and a plurality of conductive layers 422 disposed on a first main surface (top surface) of the core layer 410, and a plurality of insulating layers 431 and a plurality of conductive layers 432 disposed on a second main surface (bottom surface) of the core layer 410. The insulating layers 421 and 431 and the conductive layers 422 and 432 are disposed on the respective main surfaces of the core layer 410 according to the build-up technique. Here, the core layer 410 serves as a ground conductor of a reference potential (ground). Conductive lands 401 or wires 402 are disposed on the first main surface (top surface) of the circuit board 400 for mounting components thereon. In addition, a plurality of terminal electrodes 405 are disposed on an edge portion of the second main surface (bottom surface) of the circuit board 400. A plurality of ground electrodes 406 that are larger than the plurality of terminal electrodes 405 in area are disposed on a region of the second main surface (bottom surface) of circuit board 400 interior to the region where the plurality of terminal electrodes 405 are disposed. The high-frequency switch 101 and the first duplexer 110 are soldered to the plurality of lands 401.

Through-holes 411 for accommodating components are formed in the core layer 410. In the through-holes 411, the RFIC 160, the second duplexer 120, and the power amplifier IC 155 are disposed. Thus, the thickness of the core layer 410 is preferably greater than the heights of the electronic components embedded therein and has a higher refractive index than the electronic components. In addition, the core layer 410 is made of a conductive material and electrically grounded. Thus, the core layer 410 may be regarded as a conductive layer of the multilayered circuit board 400 in a broader sense. In the second embodiment, the core layer 410 is made from a metal plate, and more particularly, a metal plate formed of copper or a copper alloy. Spaces between the components accommodated in the through-holes 411 are filled with an insulator, e.g., resin, such that the insulating layers 421 or 431 are integrally formed with the insulator. Terminal electrodes 160a, 120a and 155a are disposed on bottom surfaces of the RFIC 160, the second duplexer 120, and the power amplifier IC 155, respectively. The terminal electrodes 160a, 120a, and 155a are connected to the conductive layers 432 through a via conductor 442.

Similar to the high-frequency circuit module 100 according to the first embodiment, the high-frequency circuit module 300 is characterized in that the first duplexer 110 and the second duplexer 120 are disposed between the RFIC 160 and the power amplifier IC 155 as shown in FIGS. 6 and 7. Thus, the length of a signal wire 170 for inputting a received signal from the first duplexer 110 or the second duplexer 120 to the RFIC 160 can be reduced, and noise can be greatly suppressed from being mixed through the signal wire 170. As shown in FIG. 6 the received signal output from the first duplexer 110 is input to the RFIC 160 through the signal wire 170 disposed on an internal layer of the circuit board 400. The transmission signal output from the RFIC 160 is input to the power amplifier IC 155 through a signal wire 180 disposed on the internal layer of the circuit board 400. The transmission signal amplified by the power amplifier IC 155 is input to the first duplexer 110 through a signal wire 185 disposed on the internal layer of the circuit board 400. The signal wire 185 for transmitting the signal amplified by the power amplifier IC 155 is shorter than the signal wire 180 for transmitting the signal before amplification output from the RFIC 160. In FIG. 6, the signal wires through which signals are input to and output from the second duplexer 120 are omitted for simplification.

In addition, as shown in FIGS. 6 and 7, when viewed from the top of the circuit board 400, at least a portion of the RFIC 160 overlaps the high-frequency switch 101 in accordance with the second embodiment. Further, a portion of the first duplexer 110 overlaps the second duplexer 20. As described above, since components are arranged to overlap with each other, the density of components increases, thereby reducing the size of a high-frequency circuit module. In addition, such structure enables the reduction in the length of various signal wires that connect the high-frequency switch 101, the duplexers 110 and 120, the power amplifier IC 155 and the RFIC 160. Thus, signal loss, noise penetration or the like can be suppressed.

As shown in FIG. 7, when viewed from the top of the circuit board 400, the power amplifier IC 155 overlap a portion of the ground electrodes 406. In addition, as shown in FIG. 8, a ground terminal 155b that also serves as a heat-dissipating electrode of the power amplifier IC 155 is connected to the ground electrodes 406 disposed on the bottom surface of the circuit board 400 through a plurality of heat-dissipating via conductors 443. The structure described above enables the conduction of the heat generated from the power amplifier IC 155 to the ground electrodes 406 through the via conductors 443 and to the circuit board 400 including the power amplifier IC 155.

In the high-frequency circuit module 300 described above, since the duplexers 110 and 120 are disposed between the RFIC 160 and the power amplifier IC 155, the signal wire for inputting the received signal from the duplexer 110 or 120 to the RFIC 160 need not be disposed near the power amplifier IC 155. In addition, the length of the signal wire for inputting the received signal from the duplexer 110 or 120 to the RFIC 160 can be reduced. Such structure facilitates the miniaturization and high density while preventing noise from entering the receiving circuit of the RFIC 160. In addition, the transmission signal output from the RFIC 160 passes through the vicinity of the duplexers 110 and 120 to be input to the power amplifier IC 155. However, the transmission signal has only a small influence on the duplexers 110 and 120 or other circuits because the transmission signal is not yet amplified. Moreover, since the power amplifier IC 155 and the duplexers 110 and 120 are disposed adjacent to one another, the length of the signal wire transmitting the amplified transmission signal can be reduced. Accordingly, power loss and noise are minimized.

In addition, in the high-frequency circuit module 300 according to the second embodiment, the power amplifier IC 155 is embedded in the circuit board 400, and the distance between the heat-dissipating electrode 155b of the power amplifier IC 155 and the ground electrodes 406 of the circuit board 400 can be reduced. Thus, the heat dissipation efficiency of the power amplifier IC 155 is improved.

The present invention is not limited to the first and second embodiments of the present invention described above. For example, while both of the RFIC 160 and the power amplifier IC 155 are mounted on the circuit board 200 in accordance with the first embodiment, and both of the RFIC 160 and the power amplifier IC 155 are embedded in the circuit board 400 in accordance with the second embodiment, the RFIC 160 may be mounted on the circuit board and the power amplifier IC 155 may be embedded in the circuit board the circuit board. Alternatively, the RFIC 160 may be embedded in the circuit board and the power amplifier IC 155 may be mounted on the circuit board. In addition, in the first and second embodiments, the duplexers 110 and 120 or the high-frequency switch 101 may be either mounted on or embedded in the circuit board.

In addition, the structures of the signal wires installed among the RFIC 160, the power amplifier IC 155, and the duplexers 110 and 120 in accordance with the first and second embodiment are merely examples of the present invention. Thus, the signal wires may be disposed on or in the circuit board according to the specifications of the high-frequency circuit module.

Moreover, the installation structures of the duplexers 110 and 120 are not limited to the first and the second embodiments wherein the second duplexer 120 is embedded in the circuit board 200 such that the filters 122 and 124 thereof, which are individual components, are also embedded in the circuit board 200 in accordance with the first embodiment, and the second duplexer 120 is embedded in the circuit board 400 such that the filters 122 and 124 thereof, which are individual components, are packaged in accordance with the second embodiment.

While one power amplifier IC 155 in which the two high-frequency power amplifiers 151 and 152 are embedded in accordance with the first and second embodiments, the number of amplifier circuits embedded in the power amplifier IC 155 or the number of the power amplifier ICs 155 is not limited. In one embodiment of the circuit shown in FIG. 1, two power amplifier ICs corresponding to two high-frequency power amplifiers 151 and 152 may be installed on the circuit board 200. In this case, the two power amplifier ICs may be mounted on or embedded in the circuit board 200. Moreover, one of the two power amplifier ICs may be mounted on the circuit board 200 and the other power of the two amplifier ICs may be embedded in the circuit board 200.

In the first and second embodiments, the through-holes 211 and 411 are disposed in the respective core layers 210 and 410 and components such as filters, RFICs, and power amplifier ICs are disposed in the through-holes 211 and 411. However, recessed portions may be disposed in the core layers 210 and 410 instead of the through-holes 211 and 411, and the components may be disposed in the recessed portions.

In addition, while the core layers 210 and 410 made of copper or a copper alloy are exemplified in the first and second embodiments, the materials of the core layers 210 and 410 are not limited to copper and a copper alloy. For example, the core layers 210 and 410 may be made of other metals or alloys, resin, etc. In addition, the core layers 210 and 410 may or may not be conductive. Further, while the circuit boards 200 and 400 include the core layers 210 and 410 that are relatively thick in accordance with the first and second embodiments, the circuit boards 200 and 400 may be multi-layered without the core layers 210 and 410.

Furthermore, various components are exposedly mounted on the top surfaces of the circuit boards 200 and 400 in accordance with the first and second embodiments, the circuit boards 200 and 400 may be housed in a case or sealed with resin, so as to entirely or partially cover the top surfaces of the circuit boards 200 and 400.

As described above, according to the present invention, the signal wire for inputting the received signal from a duplexer to the high-frequency IC need not be disposed adjacent to the power amplifier IC. In addition, the length of the signal wire for inputting the received signal from the duplexer to the high-frequency IC can be reduced. Such structure facilitates the miniaturization and high density while preventing noise from entering the receiving circuit of the RFIC 160.

What is claimed is:

1. A high-frequency circuit module comprising:
   a circuit board including an insulating layer and a conductive layer that are alternately stacked;
   a high-frequency IC installed at the circuit board to transmit and receive a high-frequency signal;
   a power amplifier IC installed at the circuit board to amplify a transmission signal received from the high-frequency IC; and
   a duplexer installed between the high-frequency IC and the power amplifier IC to separate the transmission signal output from the power amplifier IC and input to an antenna and a received signal output from the antenna and input to the high-frequency IC from each other,
   wherein at least one of the high-frequency IC and the power amplifier IC is embedded in the circuit board.

2. The high-frequency circuit module in accordance with claim 1, wherein a signal wire for transmitting the transmission signal amplified by the power amplifier IC to the duplexer is shorter than a signal wire for transmitting the transmission signal before amplification output from the high-frequency IC to the power amplifier IC.

3. The high-frequency circuit module in accordance with claim 1, wherein the duplexer is mounted on the circuit board.

4. The high-frequency circuit module in accordance with claim 2, wherein the duplexer is mounted on the circuit board.

5. The high-frequency circuit module in accordance with claim 1, wherein the duplexer is embedded in the circuit board.

6. The high-frequency circuit module in accordance with claim 2, wherein the duplexer is embedded in the circuit board.

7. The high-frequency circuit module in accordance with claim 1, wherein the circuit board comprises a ground electrode disposed on a bottom surface thereof,
   the power amplifier IC is embedded in the circuit board, and
   the power amplifier IC comprises a heat-dissipating electrode connected to the ground electrode through a via conductor.

8. The high-frequency circuit module in accordance with claim 2, wherein the circuit board comprises a ground electrode disposed on a bottom surface thereof,
   the power amplifier IC is embedded in the circuit board, and
   the power amplifier IC comprises a heat-dissipating electrode connected to the ground electrode through a via conductor.

9. The high-frequency circuit module in accordance with claim 1, wherein the circuit board further comprises a core conductive layer thicker than the conductive layer, the core conductive layer serving as an electric ground, and
   at least one of the high-frequency IC and the power amplifier IC is disposed in a through-hole or a recessed portion disposed in the core conductive layer.

10. The high-frequency circuit module in accordance with claim 2, wherein the circuit board further comprises a core conductive layer thicker than the conductive layer, the core conductive layer serving as an electric ground, and
    at least one of the high-frequency IC and the power amplifier IC is disposed in a through-hole or a recessed portion disposed in the core conductive layer.

* * * * *